(12) United States Patent
Hwang et al.

(10) Patent No.: US 7,294,531 B2
(45) Date of Patent: Nov. 13, 2007

(54) WAFER LEVEL CHIP STACK METHOD

(75) Inventors: Hyeon Hwang, Cheonan-si (KR); Dong-Kuk Kim, Yongin-si (KR); Ki-Kwon Jeong, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 176 days.

(21) Appl. No.: 10/944,002

(22) Filed: Sep. 20, 2004

(65) Prior Publication Data

US 2005/0153522 A1   Jul. 14, 2005

(30) Foreign Application Priority Data

Jan. 9, 2004   (KR)   ....................... 10-2004-0001464

(51) Int. Cl.
*H01L 21/00*   (2006.01)
*H01L 21/301*   (2006.01)

(52) U.S. Cl. ...................... 438/108; 438/113; 438/118; 438/458; 438/460; 257/E21.705

(58) Field of Classification Search ................ 438/106, 438/109, 118, 460, 108, 458; 257/E21.705
See application file for complete search history.

(56) References Cited

U.S. PATENT DOCUMENTS 6,972,069 B2 * 12/2005 Hecht et al. ................ 156/286
6,989,285 B2 * 1/2006 Ball ............................ 438/33
2003/0232488 A1 * 12/2003 Chua et al. ................. 438/460
2004/0097054 A1 * 5/2004 Abe ............................ 438/460

FOREIGN PATENT DOCUMENTS

| JP | 2001-196523 | 7/2001 |
| JP | 2001-196528 | 7/2001 |
| KR | 2001-0094408 | 11/2001 |
| KR | 2002-0031610 | 5/2002 |

* cited by examiner

*Primary Examiner*—Michael Lebentritt
*Assistant Examiner*—Ron Pompey
(74) *Attorney, Agent, or Firm*—Harness, Dickey & Pierce, P.L.C.

(57) ABSTRACT

Provided is a method by which differently-sized chips may be stacked at the wafer level. The wafer level chip stack method utilizes first and second wafer assemblies that support first and second wafers on adhesive tapes. One or both of the supported wafers may be sawed or otherwise divided to obtain separate first and second chips that remain fixed to respective first ring frames. The first and second wafer assemblies may then be positioned and aligned so that a back surface of the second wafer faces an active surface of the first wafer. Each of the second chips may then be bonded to a corresponding first chip to form a chip stack using an adhesive layer. The chip stacks may then be detached from the wafer assemblies and attached to a substrate.

18 Claims, 9 Drawing Sheets

Ultraviolet rays

WAFER LEVEL CHIP STACK METHOD

CROSS REFERENCE TO RELATED APPLICATIONS

This U.S. non-provisional application claims priority under 35 U.S.C. § 119 from Korean Patent Application No. 2004-1464, which was filed on Jan. 9, 2004, in the Korean Intellectual Property Office, the content of which is incorporated herein in its entirety by reference.

BACKGROUND OF THE INVENTION

1. Field of the Invention

The present invention relates generally to electronic packaging technology and, more particularly, to a method for forming chip stacks at the wafer level.

2. Description of the Related Art

In the package assembly process, a chip attaching process is used to attach a semiconductor chip, that has been separated from a wafer, to a substrate, such as a lead frame or a printed circuit board, for mechanical support and forming electrical interconnections. A typical chip attaching process includes applying an adhesive material to the substrate, separating the semiconductor chip from the wafer, transferring the semiconductor chip onto the adhesive material, and applying pressure and/or heat to the semiconductor chip to complete the attachment.

As packaging technology has advanced, multi-chip packages have been developed that can integrate several chips of the same or different types in a single package. A three-dimensional chip stack package has been developed as one type of multi-chip package. In a typical the chip stack package, a lower chip is attached to the substrate and an upper chip is attached to the lower chip. If the upper and lower chips are different in type or are sized differently, the chip attaching process for each chip may require specific chip-attaching equipment.

Therefore, a conventional chip stack method includes several chip attaching steps and, as a result of the increased handling necessitated by sequentially attaching a series of chips, may increase the possibility of device failure. Furthermore, if several separate pieces of equipment are used sequentially for attaching the respective chips, additional time is required for moving the substrate from apparatus to apparatus which may increase the likelihood of damage or errors that may be reflected in lowered initial quality and/or reliability.

Various attempts to solve these problems have been disclosed in previous publications including the formation of chip stacks at the wafer level. The individual chip stacks are then separated from the wafer(s) and attached to the substrate as a multi-chip unit. However, one such method involves simultaneously sawing two wafers that are attached back surface-to-back surface. As a result, this method is generally limited to chip stacks when chips formed on the two stacked wafers are of substantially identical size and is not suitable for stacking differently-sized chips.

Other publications have taught methods of forming a chip stack with differently-sized chips. However, these conventional methods include individually separating a first chip from a first wafer and then attaching the first chip to a second chip of a second wafer, so process time is still increased relative to a wafer level process and will tend to be susceptible to many of the same problems associated with mounting a series of individual chips on a substrate. Additionally, the conventional methods may also require forming bumps on chip pads or forming extra chip pads and bumps to compensate for chip size variations and are generally unable to form a stack of more than three chips.

SUMMARY OF THE INVENTION

Exemplary, non-limiting, embodiments of the present invention provide a wafer level chip stack method that may by applied to differently-sized chips and may also form a stack of more than three chips while reducing the process time.

According to an exemplary embodiment of the present invention, the wafer level chip stack method includes preparing first and second wafer assemblies. The preparation of the first wafer assembly includes preparing a first wafer on which has are formed a plurality of first chips and fixing the first wafer to a first ring frame. The preparation of the second wafer assembly includes preparing a second wafer on which has are formed a plurality of second chips and fixing the second wafer to a second ring frame. The first and second wafer assemblies are then aligned so that a back surface of the second wafer faces an active surface of the first wafer, bonding the second chips to corresponding first chips so as to form stacks of first and second chips, and separating the stack from the wafer assemblies so that the stack may be attached to a substrate.

In the wafer level chip stack method, the second wafer assembly may include an adhesive layer formed on the back surface of the second wafer. Similarly, the first wafer assembly may further include a first adhesive tape attached to a bottom of the first ring frame such that a back surface of the first wafer is attached to the first adhesive tape. Also, the preparation of the first wafer assembly may further include sawing the first wafer into the individual first chips.

In addition, preparing the second wafer assembly may include fixing the second wafer to a temporary ring frame by attaching the back surface of the second wafer to an ultraviolet (UV) tape that has an adhesive layer and is attached to a bottom of the temporary ring frame. Also, preparing the second wafer assembly may include sawing the second wafer into the individual second chips. Preparing the second wafer assembly may also include attaching a second adhesive tape to a bottom of the second ring frame so that respective active surfaces of the second chips are attached to the second adhesive tape. Preparing the second wafer assembly may also include removing the temporary ring frame from the second wafer while the adhesive layer of the UV tape remains on the back surface of the second wafer.

BRIEF DESCRIPTION OF THE DRAWINGS

FIGS. 2 through 12 illustrate exemplary process steps of the process flow shown in FIG. 1, wherein:

DETAILED DESCRIPTION OF EXEMPLARY EMBODIMENTS

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

In the description, well-known structures and processes have not been described or illustrated in detail to avoid obscuring the present invention. Further, it will be appreciated that the figures are not drawn to scale, but that for simplicity and clarity of illustration the dimensions and relative positioning of some of the elements may be reduced, enlarged or otherwise modified relative to other elements. The same reference numerals and characters are used to identify similar and corresponding parts of the various drawings.

Figure 1:
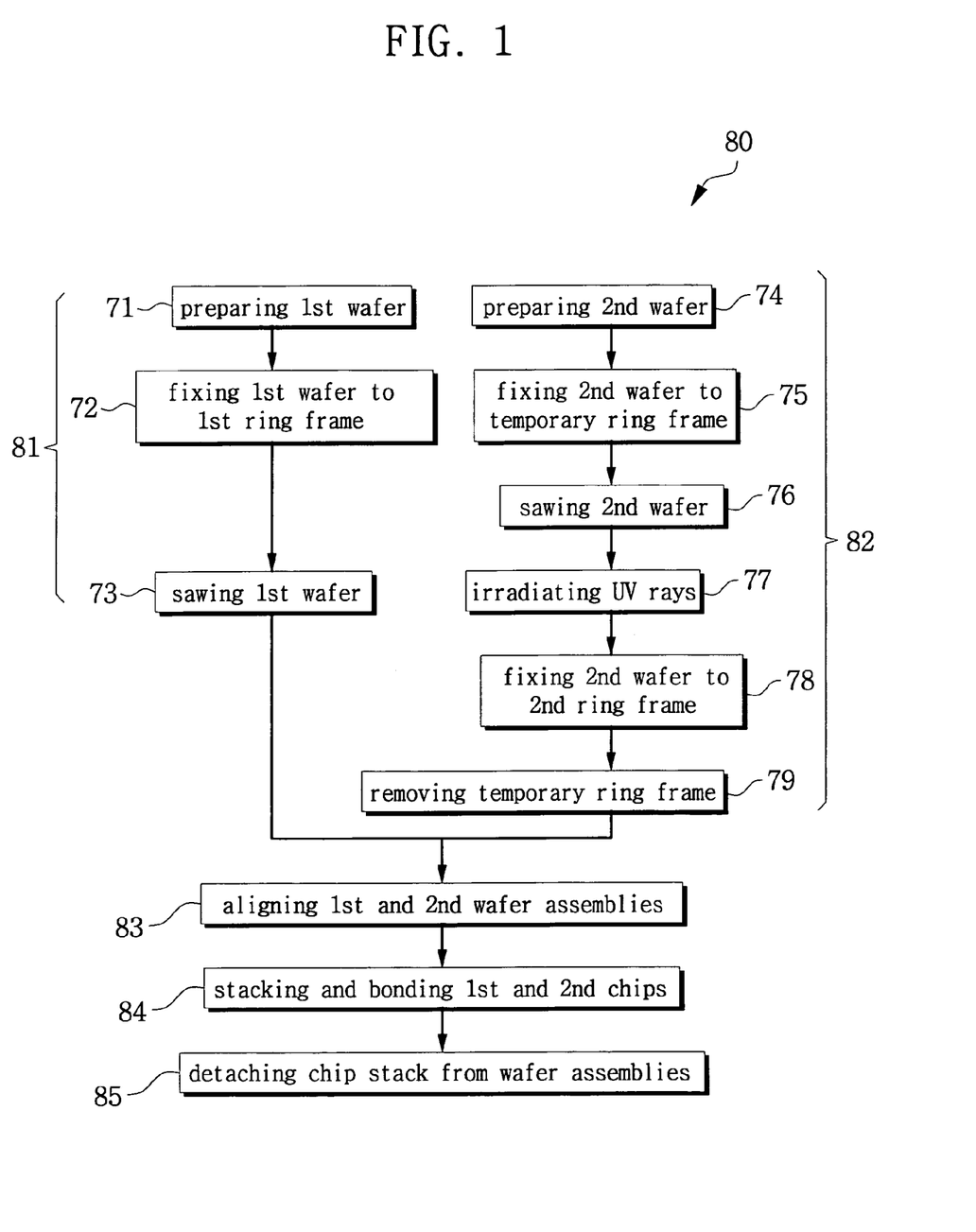
FIG. 1 is a process flow for a wafer level chip stack method according to an exemplary embodiment of the present invention.
Figure 2:
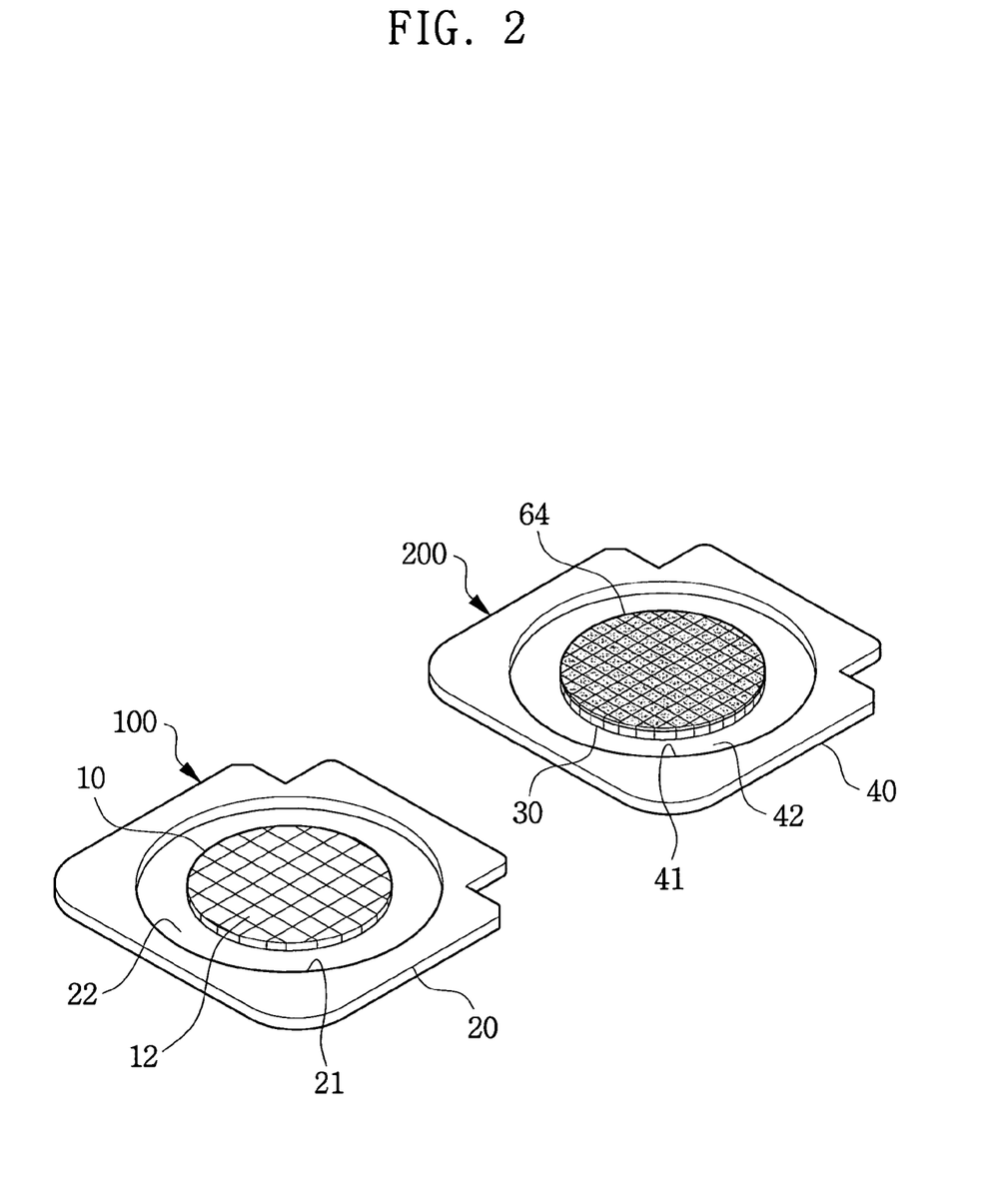
FIG. 2 is a perspective view showing first and second wafer assemblies.

FIG. 1 shows a process flow for a wafer level chip stack method 80 in accordance with an exemplary embodiment of the present invention with FIGS. 2-12 illustrating exemplary process steps of the process flow shown in FIG. 1. Referring to FIG. 1, the wafer level chip stack method 80 includes a sequence of steps 81 for preparing a first wafer assembly, and a sequence of steps 82 for preparing a second wafer assembly. FIG. 2 shows, in a perspective view, the first wafer assembly 100 and the second wafer assembly 200.

Figure 11:
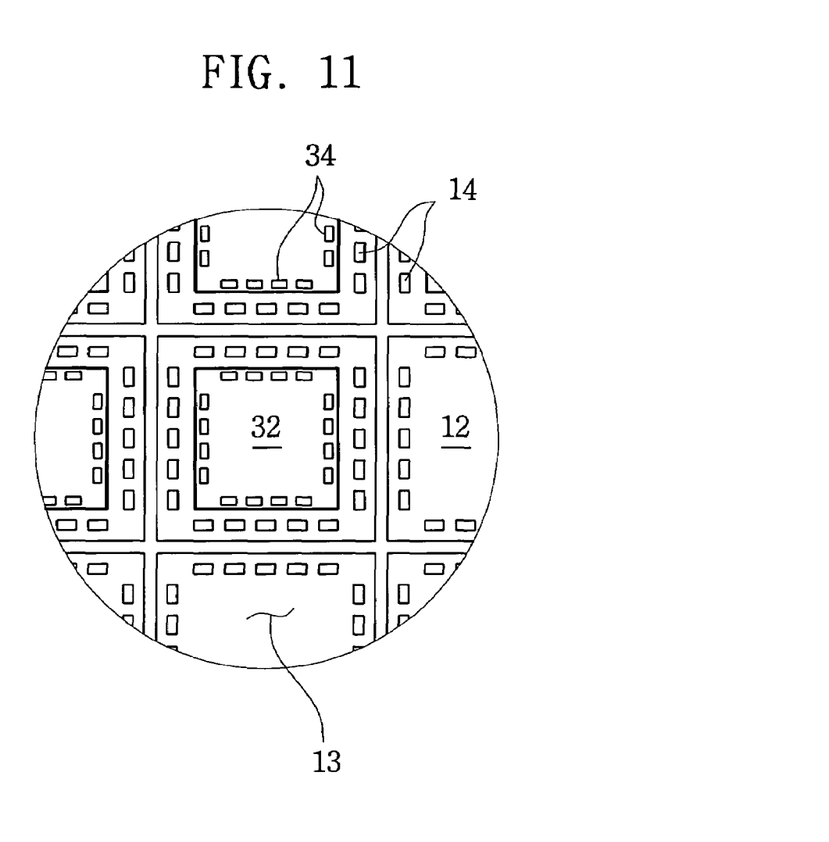
FIG. 11 is a plan view of the chip stack shown in FIG. 10.

Referring to FIGS. 1 and 2, in preparing the first wafer assembly 100, a first wafer 10 is prepared (step 71 in FIG. 1) and fixed to a first ring frame 20 (step 72 in FIG. 1). The first wafer 10 contains a plurality of first chips 12. As also shown in FIG. 11, each first chip 12 may be an edge-pad type chip in which a plurality of chip pads 14 are provided near edges of an active surface 13 of the chip 12. To provide a thinner chip stack, the first wafer 10 may be back-lapped using conventional method well known in this art to reduce its thickness.

In order to fix the first wafer 10, a first adhesive tape 22 is used together with the first ring frame 20. The first ring frame 20 has a generally circular center opening 21 sized to accommodate the first wafer 10 therein. The first adhesive tape 22 is attached to a bottom surface of the first ring frame 20 and exposed through the circular center opening 21. A back surface of the first wafer 10 is attached to an exposed portion of the first adhesive tape 22. The first adhesive tape 22 may be a conventional dicing tape or an ultraviolet tape.

The first wafer 10, after being fixed to the first ring frame 20, is subjected to a wafer-sawing step (step 73 in FIG. 1) to separate the individual first chips 12 from the wafer, while their orientation is maintained by the first adhesive tape 22. Those skilled in this art will appreciate that a suitable sawing tool, such as a diamond wheel or a laser, may be used for the wafer-sawing step.

Figure 3:
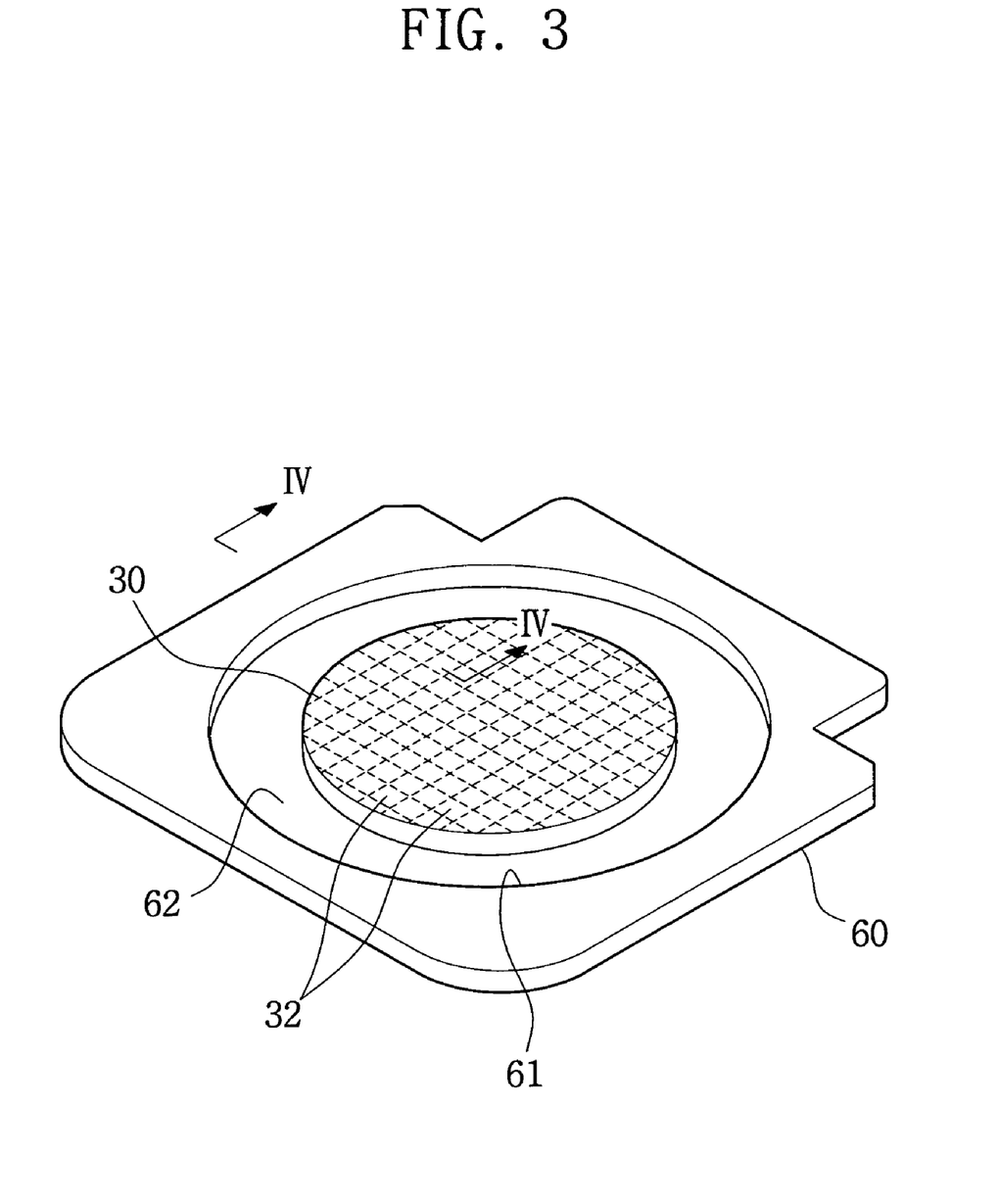
FIG. 3 is a perspective view showing a step of fixing a second wafer to a temporary ring frame.
Figure 4:
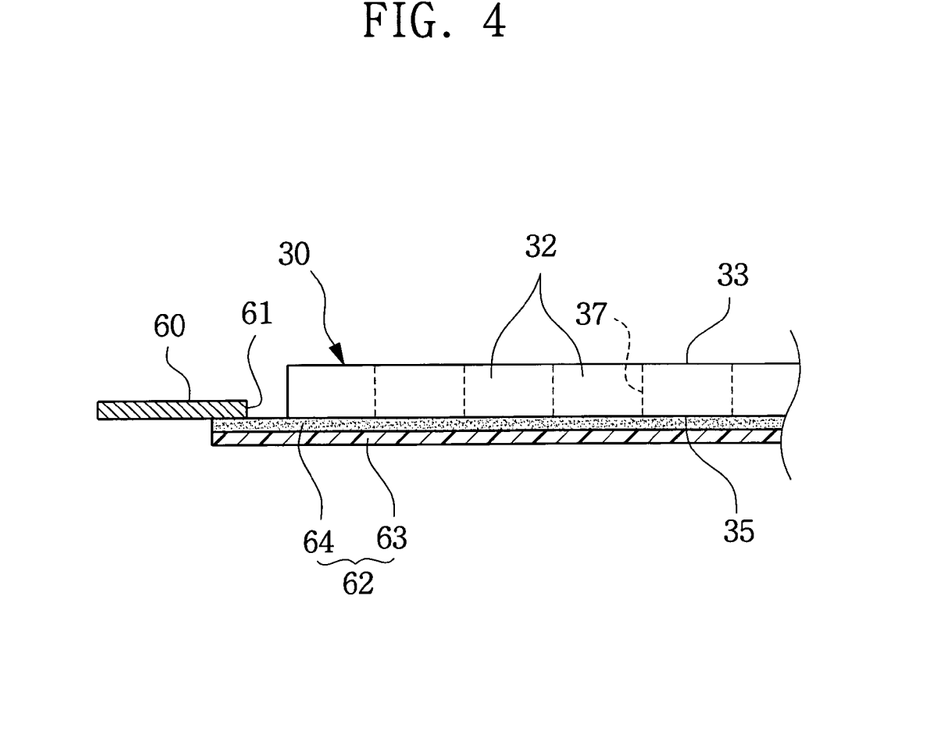
FIG. 4 is a cross-sectional view taken along the line IV-IV in FIG. 3.

The steps of preparing the second wafer assembly 200 are illustrated in FIGS. 3-7. As shown in FIGS. 3 and 4, the second wafer 30 is prepared (step 74 in FIG. 1) and temporarily fixed to a temporary ring frame 60 (step 75 in FIG. 1). FIG. 4 is a cross-sectional view taken along the line IV-IV in FIG. 3. The second wafer 30 contains a plurality of second chips 32. As also shown in FIG. 11, each second chip 32 may be an edge-pad type chip in which a plurality of chip pads 34 are provided near edges of an active surface 33 of the chip 32. In an alternative embodiment, the second chip 32 may be a center-pad type chip. However, if another chip is to be stacked on the second chip 32, the second chip 32 will typically be an edge-pad type chip. In this exemplary embodiment, the second chips 32 are smaller than the first chips 12. In order to achieve a thinner chip stack, the second wafer 30 may also be back-lapped.

The second wafer 30 may be fixed using an ultraviolet tape 62 in combination with a temporary ring frame 60. The temporary ring frame 60 has a generally circular center opening 61 sized to accommodate the second wafer 30 therein. A peripheral portion of the UV tape 62 is attached to a bottom surface of the temporary ring frame 60 leaving the central portion of the tape exposed through the circular center opening 61. A back surface 35 of the second wafer 30 may then be attached to the exposed portion of the UV tape 62. The UV tape will typically include both a base film 63 and an adhesive layer 64. The UV tape is formulated and constructed so that when UV tape is exposed to UV radiation, the adhesive strength between the base film 63 and the adhesive layer 64 is reduced, thereby allowing the layers to be more easily separated.

Figure 5:
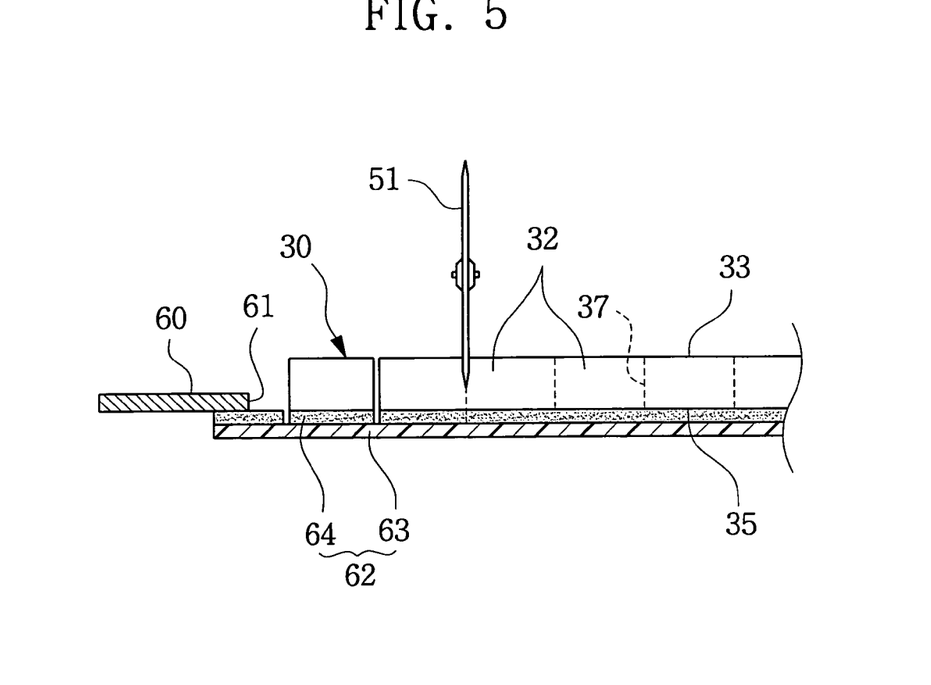
FIG. 5 is a cross-sectional view showing a step of sawing the second wafer.
Figure 6:
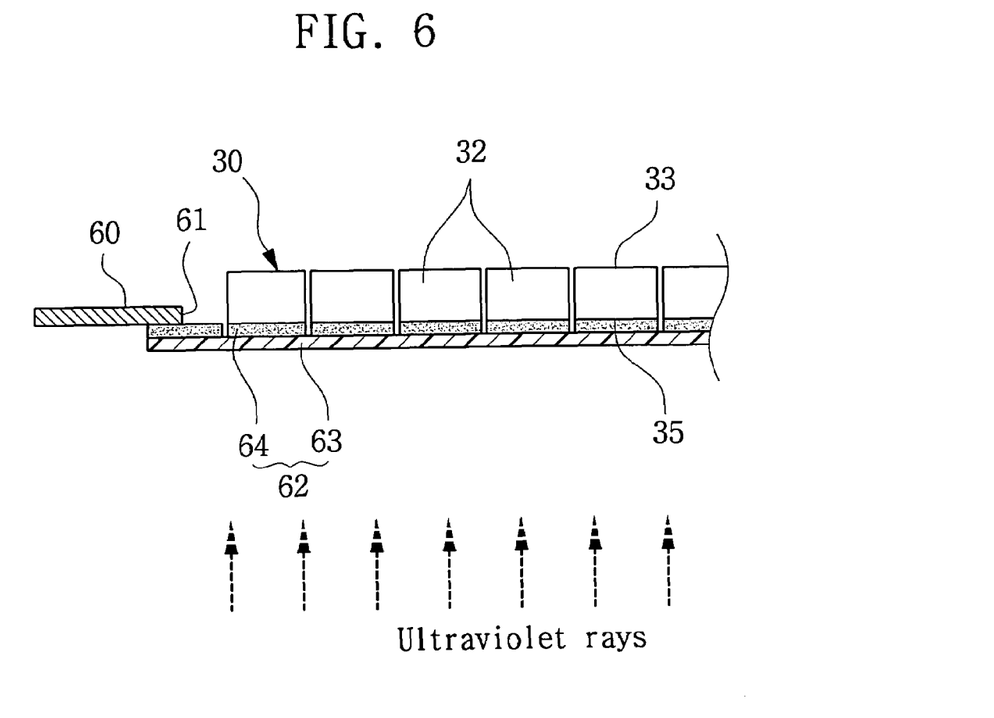
FIG. 6 is a cross-sectional view showing a step of irradiating the adhesive layer with ultraviolet rays.

Next, as shown in FIG. 5, the second wafer 30, after being fixed to the temporary ring frame 60, is subjected to a wafer-sawing step (step 76 in FIG. 1). In this wafer-sawing step, a sawing tool such as a diamond wheel 51 is used to remove portions of the second wafer 30 along sawing or kerf lines 37. The wafer-sawing step separates the individual second chips 32 from each other, while the UV tape 62 maintains the relative positioning of the chips. When the second wafer 30 is sawed, the cutting or sawing device may be adjusted so that portions of the adhesive layer 64 of the ultraviolet tape 62 underlying the sawing lines 37 are also removed. Next, as shown in FIG. 6, the ultraviolet tape 62 is exposed to ultraviolet radiation (step 77 in FIG. 1) thereby reducing the adhesive strength between the base film 63 and the adhesive layer 64.

Figure 7:
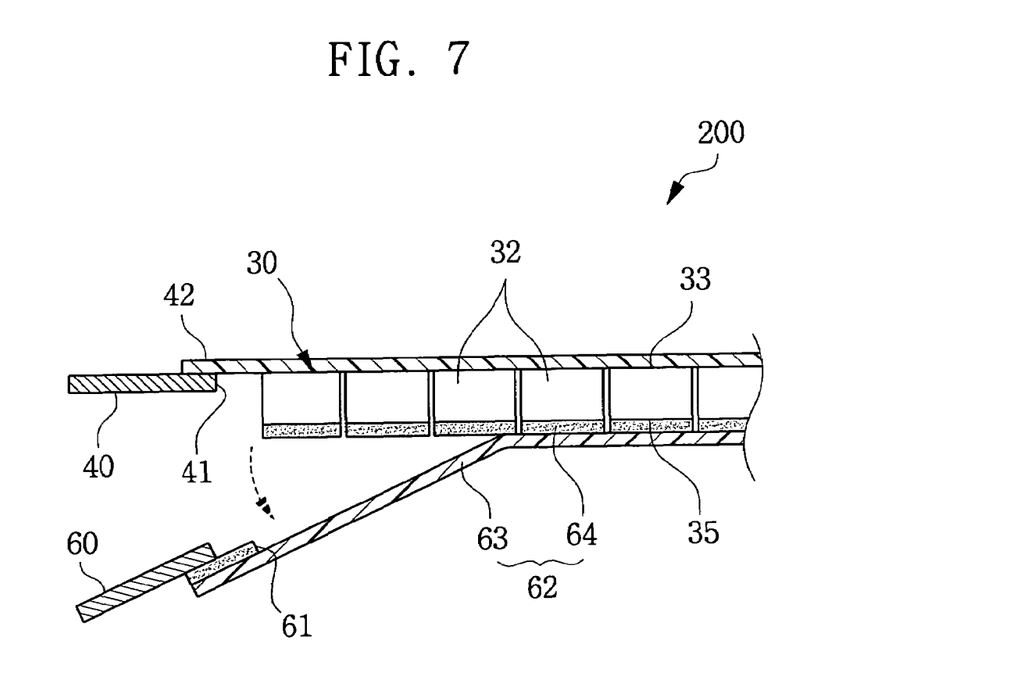
FIG. 7 is a cross-sectional view showing a step of fixing the second wafer to a second ring frame.

Next, as shown in FIG. 7, the second wafer 30 is fixed to a second ring frame 40 (step 78 in FIG. 1). As also shown in FIG. 2, the second ring frame 40 has a circular center opening 41, and a second adhesive tape 42 is attached to a bottom surface (a top in FIG. 7) of the second ring frame 40. The active surfaces of the separated second chips 32 from the second wafer 30 may then be attached to an exposed portion of the second adhesive tape 42.

After the remaining portion of the second wafer 30, i.e., the separated second chips 32, is attached to the second adhesive tape 42, the temporary ring frame 60 is removed from the second wafer 30 (step 79 in FIG. 1). When the temporary ring frame 60 is removed, the base film 63 of the UV tape 62 is detached from the adhesive layer 64 and removed together with the temporary ring frame 60. The portions of the adhesive layer 64 of the UV tape 62 attached to the back surfaces 35 of the second chips 32 will, however, remain in place.

FIG. 2 illustrates the resultant first and second wafer assemblies 100 and 200. As detailed above, the first wafer assembly will include a first wafer 10 attached to the first adhesive tape 22 and the second wafer assembly 200 will have a second wafer 30 attached to the second adhesive tape 42. As also detailed above, the back surfaces of the separated second chips will be covered with residual portions of the adhesive layer 64. The steps 81 and 82 of preparing the first and second wafer assemblies 100 and 200 may be performed sequentially on the same stage or either simultaneously or sequentially on different stages.

Figure 8:
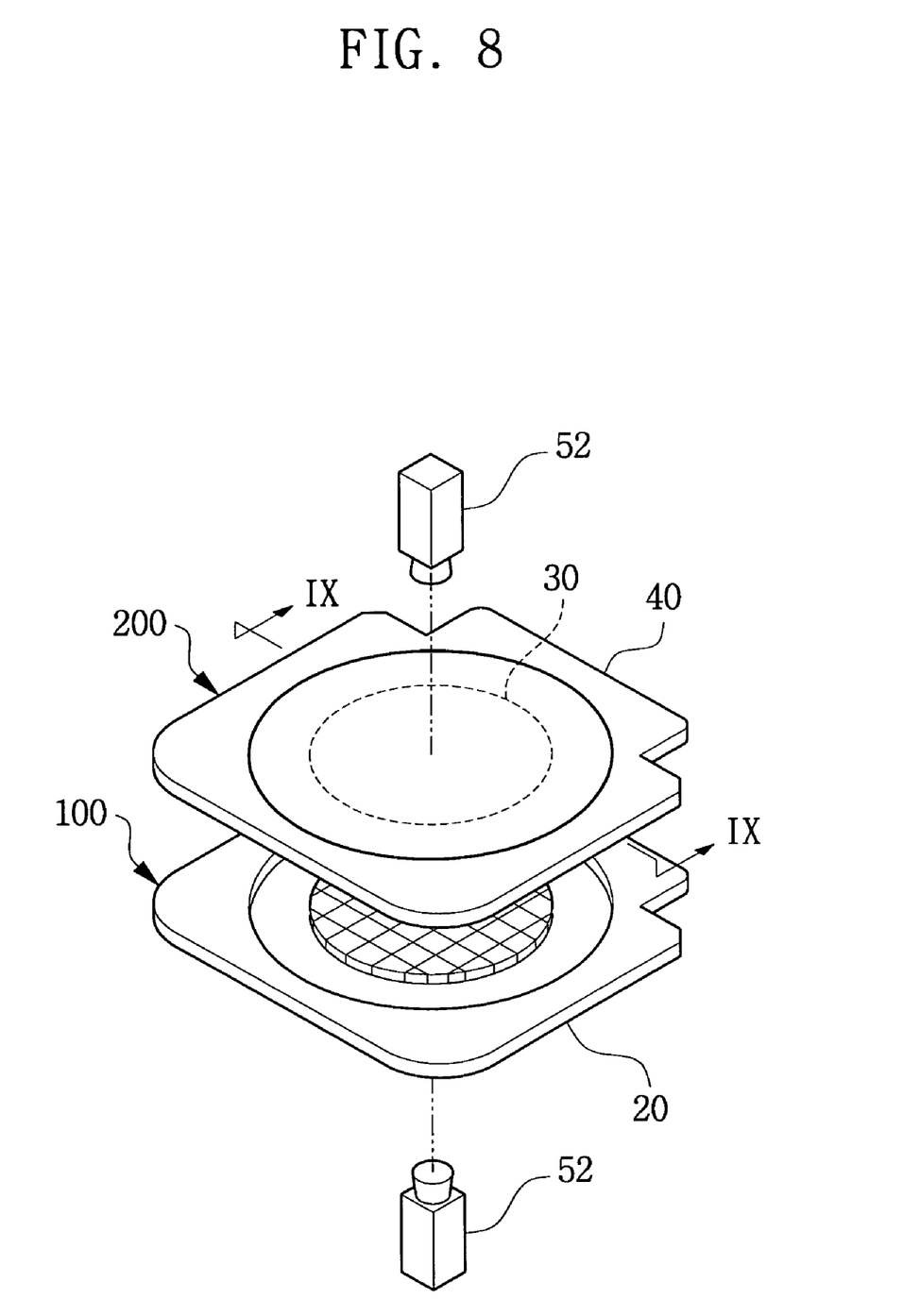
FIG. 8 is a perspective view showing a step of aligning the first and second wafer assemblies.

The first and second wafer assemblies 100 and 200 are then aligned (step 83 in FIG. 1). FIG. 8 shows, in a perspective view, the aligning step of the first and second wafer assemblies, and FIG. 9 is a cross-sectional view taken along the line IX-IX in FIG. 8.

Figure 9:
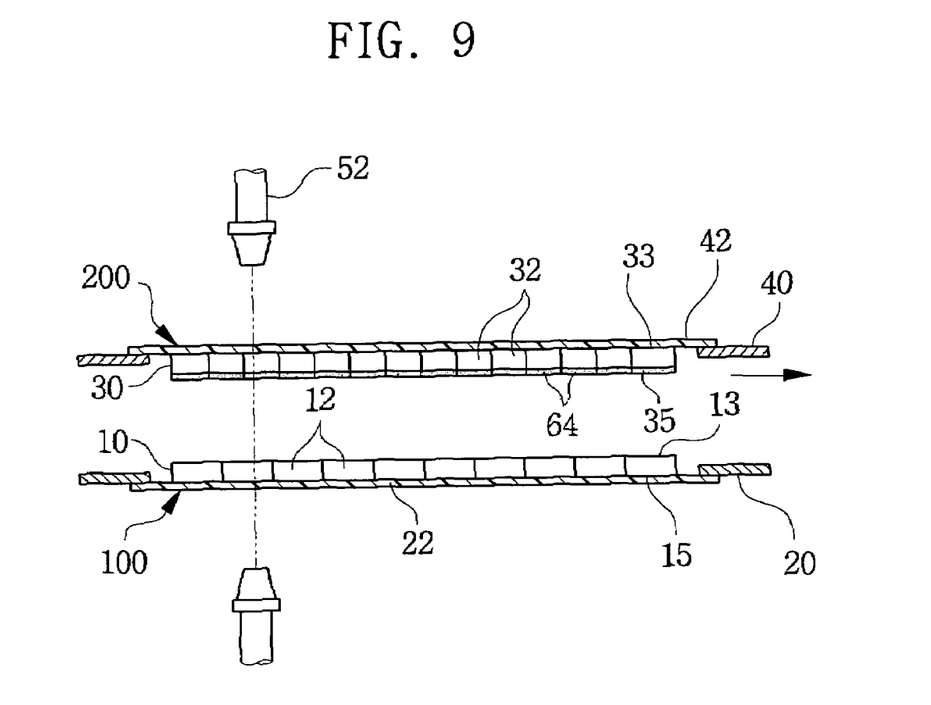
FIG. 9 is a cross-sectional view taken along the line IX-IX in FIG. 8.

Referring to FIGS. 8 and 9, the second wafer assembly 200 is positioned over the first wafer assembly 100 so that the back surface 35 of the second wafer 30 faces the active surface 13 of the first wafer 10. Then, by using a suitable optical aligning tool 52, one of the second chips 32I will be aligned with a corresponding one of the first chips 12. It will be appreciated that because the construction and operation of optical aligning tools are well known in this art, no detailed discussion of such devices is provided therein.

Figure 10:
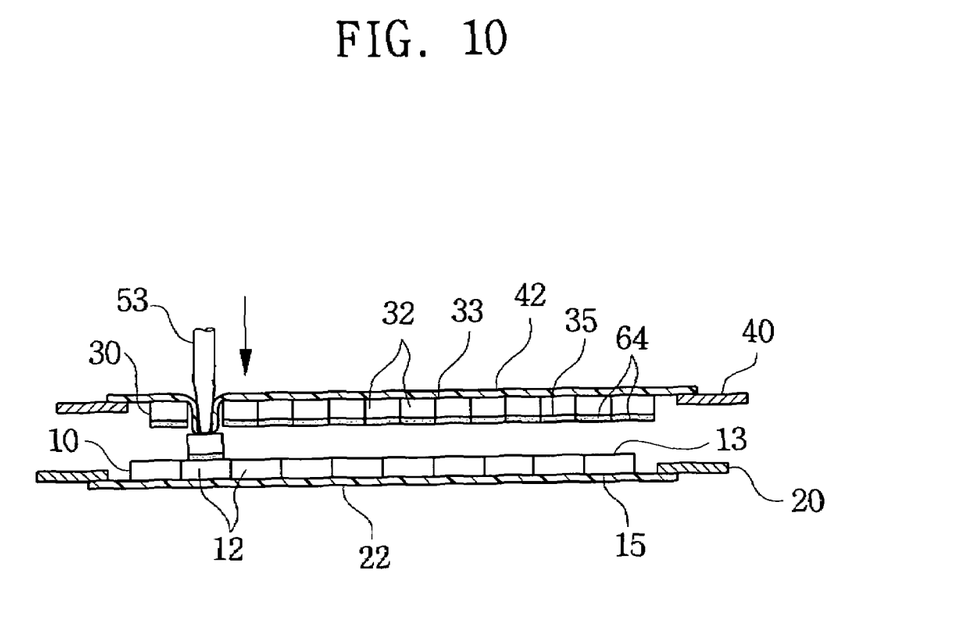
FIG. 10 is a cross-sectional view showing a step of forming a chip stack at wafer level.

Next, as shown in FIG. 10, the second chip 32 is stacked on and bonded to the first chip 12 (step 84 in FIG. 1). This chip-bonding step 84 may be accomplished with a suitable bonding tool 53, located above the second wafer assembly 200, that extends toward and presses down a portion of the second adhesive tape 42. The pressure applied by the bonding tool 53 will tend to force the second chip 32 into contact with the first chip 12, thereby bonding the second chip to the active surface 13 of the first chip 12 by utilizing the portion of the adhesive layer 64 remaining on the back surface 35 of the second chip 32.

After the first and second chips 12 and 32 are bonded together, the bonding tool 53 may be withdrawn to a position above the second wafer assembly 200. The withdrawal of bonding tool 53 allows the second adhesive tape 42 to be detached from the second chip 32 due to elastic restoration and leave a stack of the first and second chips 12 and 32 attached to the first adhesive tape 12. It will be appreciated that because the structure and operation of bonding tools 53 is well known in this art, no detailed discussion of such devices is provided herein.

FIG. 11 shows, in a plan view, the stack of the first and second chips 12 and 32. As shown in FIG. 11, the second chip 32 is sized and positioned so as not to obstruct the chip pads 14 of the first chip 12 and allow interconnections to be formed to both chips.

Figure 12:
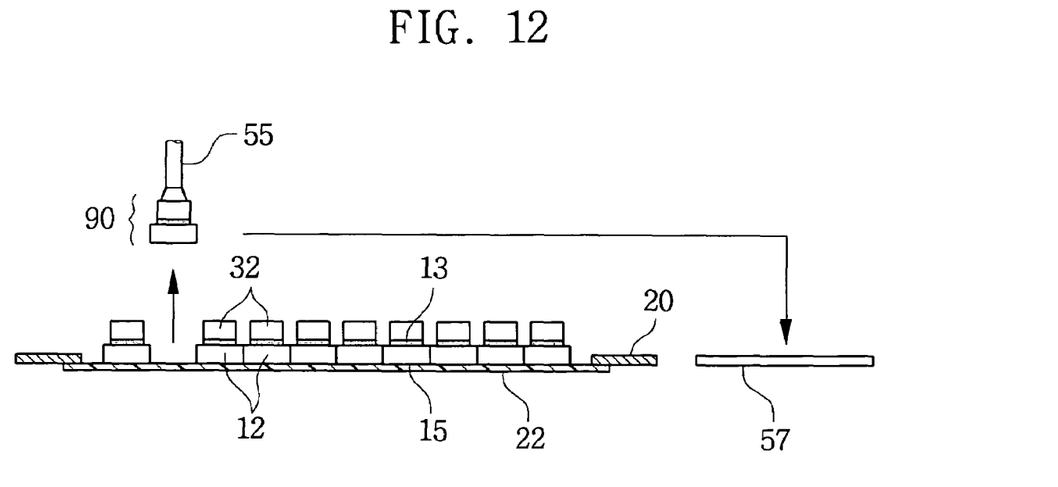
FIG. 12 is a cross-sectional view showing a step of detaching the chip stack from the wafer assemblies.

Next, as shown in FIG. 12, the chip stack 90 is detached from the first adhesive tape 12 and then attached to a substrate 57 (step 85 in FIG. 1). As will be appreciated by those skilled in this art, and suitable pickup tool 55 may be used to achieve this transfer. If the first adhesive tape 22 is an UV tape, a portion of the adhesive layer of the first adhesive tape 22 may remain attached to the back surface 15 of the first chip 12 and be used to attach the chip stack 90 to the substrate 57, thereby eliminating the need to apply another adhesive material to the substrate. If the first adhe-sive tape 22 is a conventional dicing tape, another suitable adhesive material will typically be applied to the substrate 57 for attaching the chip stack 90 to the substrate.

The aligning and chip-bonding steps 83, 84 may then be repeated for each corresponding pair of first and second chips 12 and 32 to form a plurality of individual chip stacks 90 at the wafer level. Further, the individual chip stacks 90 may be removed and applied in sequence to respective substrates 57 for forming chip stack packages. While the chip stacks 90 are being formed, suitable supporters (not shown) such as ring frame holders may be utilized to support the first and second ring frames 20 and 40. The supporters and/or associated mechanisms may be arranged and configured to that either or both ring frames 20 and 40 may be moved in every direction in order to align the corresponding first and second chips.

Figure 13:
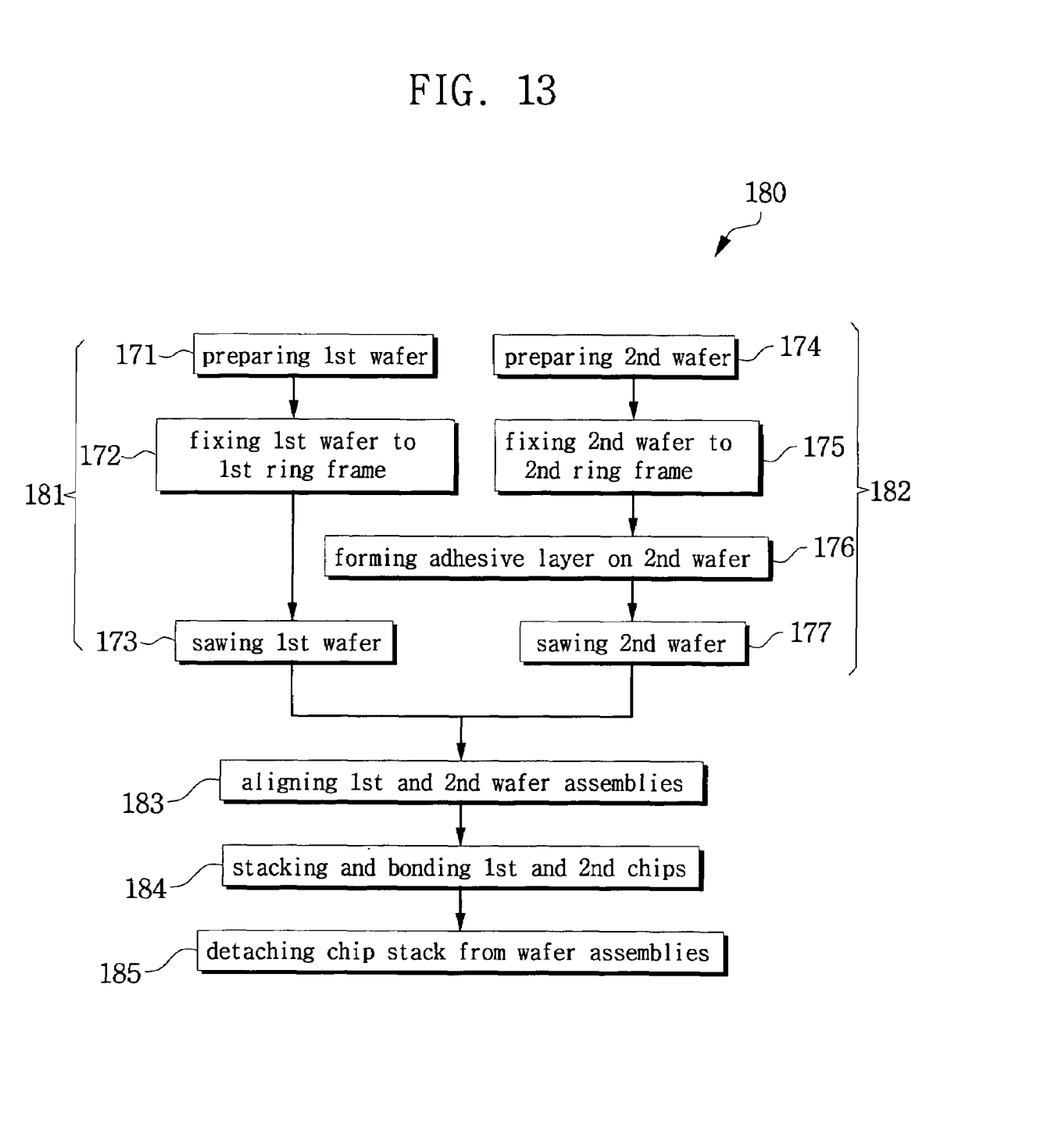
FIG. 13 is a process flow for a wafer level chip stack method according to another exemplary embodiment of the present invention.

In the exemplary embodiment discussed above, the adhesive layer on the back surface of the second chip was formed using a UV tape. However, it will be appreciated that the adhesive layer on the back surface of the second chips may be formed directly without using a UV tape as reflected in the exemplary embodiment described below. FIG. 13 shows a process flow for a wafer level chip stack method 180 in accordance with another exemplary embodiment of the present invention.

Referring to FIG. 13, the wafer level chip stack method 180 in this embodiment is similar with the aforementioned method, except with regard to steps 182 for preparing the second wafer assembly. Accordingly, descriptions of the corresponding steps are not repeated. The steps 182 of providing the second wafer assembly also include a step of preparing 174 the second wafer. The second wafer is then fixed to the second ring frame by attaching an adhesive film to the active surface (step 175). The adhesive layer that will be used to from the chip stack is then formed directly on the back surface of the second wafer (step 176). The adhesive layer may be selected from the many suitable, non-conductive adhesive materials known in the art and may be used in the form of sheet, tape, film or other configurations. Next, the second wafer, together with the adhesive layer, is sawed (step 179) to form separated second chips with an adhesive layer provided on their back surfaces.

Although the foregoing exemplary embodiments illustrate stacking two chips at the wafer level, the invention is not so limited, and those skilled in this art will appreciate that three or more chips may be stacked according to the wafer level chip stack method of the invention. Further, those skilled in this art will appreciate that the wafer-sawing step for the first wafer may be performed after the chip-stacking step has been completed.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of forming a wafer level chip stack comprising:
preparing a first wafer assembly that supports a first wafer, the first wafer including a plurality of first chips sawed to have a first chip size;
preparing a second wafer assembly that supports a second wafer, the second wafer including a plurality of second chips sawed to have a second chip size different from the first chip size;

positioning the first and second wafer assemblies so that a first surface of one of the plurality of first chips is arranged adjacent to and aligned with a first surface of a corresponding one of the plurality of second chips, wherein the first surface of one of the plurality of first chips is an active surface and the first surface of a corresponding one of the plurality of second chips is a back surface;

bonding the first surface of the aligned first chip to the first surface of the corresponding second chip to form a chip stack supported by the first wafer assembly; and detaching the chip stack from the first wafer assembly.

2. A method of forming a wafer level chip stack according to claim 1, wherein:

preparing the second wafer assembly further includes providing an adhesive region on the first surface of the plurality of second chips. chips.

3. A method of forming a wafer level chip stack according to claim 2, wherein:

providing the adhesive layer further includes forming an adhesive layer on a first major surface of the second wafer; and removing portions of the second wafer and corresponding portions of the adhesive layer to separate the plurality of second chips and form an adhesive region on the first surface of the second chips.

4. A method of forming a wafer level chip stack according to claim 3, wherein:

removing portions of the second wafer includes sawing through regions of the second wafer between adjacent ones of the plurality of second chips.

5. A method of forming a wafer level chip stack according to claim 1, wherein:

preparing the first wafer assembly further includes attaching a first adhesive tape to a bottom surface of a first ring frame, a central portion of the first adhesive tape covering a central opening provided in the first ring frame; and attaching a second surface of the first wafer to the central portion of the first adhesive tape.

6. A method of forming a wafer level chip stack according to claim 5, wherein:

preparing the first wafer assembly further includes removing regions of the first wafer to separate the plurality of first chips.

7. A method of forming a wafer level chip stack according to claim 1, wherein:

preparing the second wafer assembly further includes attaching a film of ultraviolet tape to a temporary ring frame, a central portion of the ultraviolet tape covering a central opening provided in the temporary ring frame and wherein the ultraviolet tape includes an adhesive layer and a base layer;

attaching a first major surface of the second wafer to the central portion of the ultraviolet tape.

8. A method of forming a wafer level chip stack according to claim 7, wherein:

preparing the second wafer assembly further includes removing portions of the second wafer and portions of the adhesive layer of the ultraviolet tape to separate the plurality of second chips, the ultraviolet tape being attached to the first surface of the second chips.

9. A method of forming a wafer level chip stack according to claim 7, wherein:

preparing the second wafer assembly further includes attaching a layer of a second adhesive tape to a bottom of a second ring frame, a central region of the second adhesive tape covering a central opening provided in the second ring frame; and attaching a second surface of the second chips to the central region of the second adhesive tape.

10. A method of forming a wafer level chip stack according to claim 9, wherein:

preparing the second wafer assembly further includes removing the base layer of the ultraviolet tape from the first surface of the second chips whereby residual portions of the adhesive layer of the ultraviolet tape form adhesive regions on the first surface of the second chips.

11. A method of forming a wafer level chip stack according to claim 10, wherein:

the ultraviolet tape is exposed to ultraviolet radiation of sufficient intensity and duration to reduce a level of adhesion between the adhesive layer and the base layer before removing the base layer.

12. A method of forming a wafer level chip stack according to claim 1, wherein:

preparing the second wafer assembly further includes attaching a layer of a second adhesive tape to a bottom of a second ring frame, a central portion of the second adhesive tape covering a central opening provided in the second ring frame; and attaching an active surface of the second wafer to the central portion of the second adhesive tape.

13. A method of forming a wafer level chip stack according to claim 12, wherein:

preparing the second wafer assembly further includes forming an adhesive layer on the first surface of the second wafer.

14. A method of forming a wafer level chip stack according to claim 13, wherein:

preparing the second wafer assembly further includes removing portions of the second wafer and the adhesive layer to form the plurality of second chips wherein a portion of the adhesive layer remains on the first surface of the second chips to form an adhesive region.

15. A method of forming a wafer level chip stack according to claim 1, wherein:

bonding the first surface of the aligned first chip to the first surface of the corresponding second chip includes providing an adhesive region on the first surface of the corresponding second chip; and urging the adhesive region against the first surface of the first chip using a combination of temperature and pressure sufficient to cause the adhesive region to bond the second chip to the first chip.

16. A method of forming a wafer level chip stack according to claim 1, wherein:

the second chip fits within a periphery of the first chip.

17. A method of forming a wafer level chip stack according to claim 16, wherein:

the first surface of the first chip is an active surface having a plurality of chip pads arranged adjacent an edge of the active surface.

18. A method of forming a wafer level chip stack according to claim 16, wherein:

the second chip is positioned on the active surface of the first chip remain exposed.

* * * * *